US010937685B2

(12) United States Patent
Gu et al.

(10) Patent No.: US 10,937,685 B2
(45) Date of Patent: Mar. 2, 2021

(54) DIFFUSION BREAK STRUCTURES IN SEMICONDUCTOR DEVICES

(71) Applicant: GLOBALFOUNDRIES INC., Grand Cayman (KY)

(72) Inventors: Sipeng Gu, Clifton Park, NY (US); Haiting Wang, Clifton Park, NY (US); Jiehui Shu, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/446,588

(22) Filed: Jun. 19, 2019

(65) Prior Publication Data

US 2020/0402838 A1 Dec. 24, 2020

(51) Int. Cl.
| | |
|---|---|
| *H01L 21/768* | (2006.01) |
| *H01L 21/762* | (2006.01) |
| *H01L 21/8234* | (2006.01) |
| *H01L 27/092* | (2006.01) |
| *H01L 27/088* | (2006.01) |

(52) U.S. Cl.
CPC ........ *H01L 21/76224* (2013.01); *H01L 21/823481* (2013.01); *H01L 27/0886* (2013.01); *H01L 27/092* (2013.01)

(58) Field of Classification Search
CPC ................................. H01L 21/76877
See application file for complete search history.

(56) References Cited

U.S. PATENT DOCUMENTS

| | | | |
|---|---|---|---|
| 8,846,491 B1 | 9/2014 | Pham et al. | |
| 9,406,676 B2 | 8/2016 | Yu et al. | |
| 2015/0056801 A1* | 2/2015 | Park | H01L 21/76847 438/655 |
| 2015/0332963 A1* | 11/2015 | Wu | H01L 21/76804 438/668 |
| 2017/0229440 A1* | 8/2017 | Lu | H01L 21/76816 |
| 2019/0013268 A1* | 1/2019 | Greene | H01L 21/76895 |

* cited by examiner

*Primary Examiner* — Thao P Le
(74) *Attorney, Agent, or Firm* — David Cain

(57) ABSTRACT

The present disclosure generally relates to semiconductor devices and processing. The present disclosure also relates to isolation structures formed in active regions, more particularly, diffusion break structures in an active semiconductor layer of a semiconductor device. The present disclosure also relates to methods of forming such structures and replacement metal gate processes.

19 Claims, 11 Drawing Sheets

DIFFUSION BREAK STRUCTURES IN SEMICONDUCTOR DEVICES

FIELD OF THE INVENTION

The present disclosure generally relates to semiconductor devices and processing. The present disclosure also relates to isolation structures formed in active regions, more particularly, diffusion break structures in an active semiconductor layer of a semiconductor device. The present disclosure also relates to methods of forming such structures and replacement metal gate processes.

BACKGROUND

The semiconductor industry's drive for higher density, higher performance, lower-cost devices and the implementation of nanometer-scale process nodes have resulted in the development of various integrated circuit devices, such as multi-gate transistors (e.g., dual-gate transistors, tri-gate transistors, etc.), and various device architectures, such as three-dimensional (3D) fin-shaped field effect transistors (FinFETs), and planar transistor devices built on bulk substrates or substrates with a buried insulator layer (i.e., semiconductor-on-insulator device).

The various IC devices that are formed for a semiconductor product must be electrically isolated from one another to properly function in an electrical circuit. Typically, this can be accomplished by forming a trench in a substrate and filling the trench with an insulating material. Within the industry, these isolation structures may sometimes be referred to as "diffusion breaks". However, the formation of such isolation structures consumes valuable plot space in the substrate. This is especially problematic in view of the demand for smaller device dimensions and higher packing densities of IC device components.

A possible approach to fabricate diffusion break structures may include forming the trench in a substrate, followed by forming source or drain contacts in the substrate using epitaxial growth (i.e., "diffusion break first"). However, the diffusion break first approach may result in epitaxial growth of structures with upper surfaces that extend at an oblique angle with respect to an axis which is perpendicular to the surface of the substrate. The oblique profile of the upper surface may be referred to as "facets" on the epitaxial structures. "Faceted" epitaxial structures are found to prevent electrical contacts from fully contacting (i.e., "landing on") the epitaxial structures, thereby resulting in device yield issues.

Another possible approach to fabricate diffusion break structures may include forming the source or drain contacts in the substrate, followed by forming the trench in the substrate (i.e., "diffusion break last"). However, the diffusion break last approach may result in the trench sidewalls to have a "bowed" section which is adjacent to the source or drain contacts in the substrate. The bowed section of the trench is formed due to the erosion of material in the adjacent source or drain contacts (e.g., erosion of epitaxial structures) during the trench etch process, which also results in device yield issues.

Therefore, there is a need to provide structures in a semiconductor device and methods of forming the same that can overcome, or at least ameliorate, one or more of the disadvantages as described above.

SUMMARY

In an aspect of the present disclosure, there is provided a semiconductor device having a semiconductor feature above a substrate, a pair of gate spacers having upper and lower portions on the semiconductor feature, an isolation trench in the semiconductor feature, an isolation structure having a lower portion disposed in the isolation trench and having an upper portion disposed between the lower portions of the pair of gate spacers that extends above the semiconductor feature, and a conductive gate structure disposed on the isolation structure and between the upper portions of the pair of gate spacers.

In another aspect of the present disclosure, there is provided a semiconductor device having a first, second and third semiconductor features above a substrate, a pair of gate spacers having upper and lower portions disposed on and extending laterally across the first, second and third semiconductor features, an isolation trench in the second semiconductor feature, an isolation structure having a lower portion disposed in the isolation trench and having an upper portion disposed between the lower portions of the pair of gate spacers that extends above the second semiconductor feature, and a conductive gate structure disposed on the isolation structure and between the upper portions of the pair of gate spacers, where the conductive gate structure extends laterally over the first and third semiconductor features.

In yet another aspect of the present disclosure, there is provided a method of forming structures in a semiconductor device by providing on a substrate, a semiconductor feature and an adjacent insulating layer, forming first and second gate cavities on the semiconductor feature, each gate cavity having a pair of gate spacers on sidewalls thereof, where the pair of gate spacers have upper and lower portions, forming and patterning a mask layer to define a diffusion break opening over the semiconductor feature and the insulating layer, etching through the diffusion break opening to form an isolation trench in the semiconductor feature and the insulating layer by etching through the diffusion break opening, forming an isolation structure having a lower portion disposed in the isolation trench and having an upper portion disposed between the lower portions of the pair of gate spacers that extends above the semiconductor feature, and forming a conductive gate structure on the isolation structure and between the upper portions of the pair of gate spacers.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1:
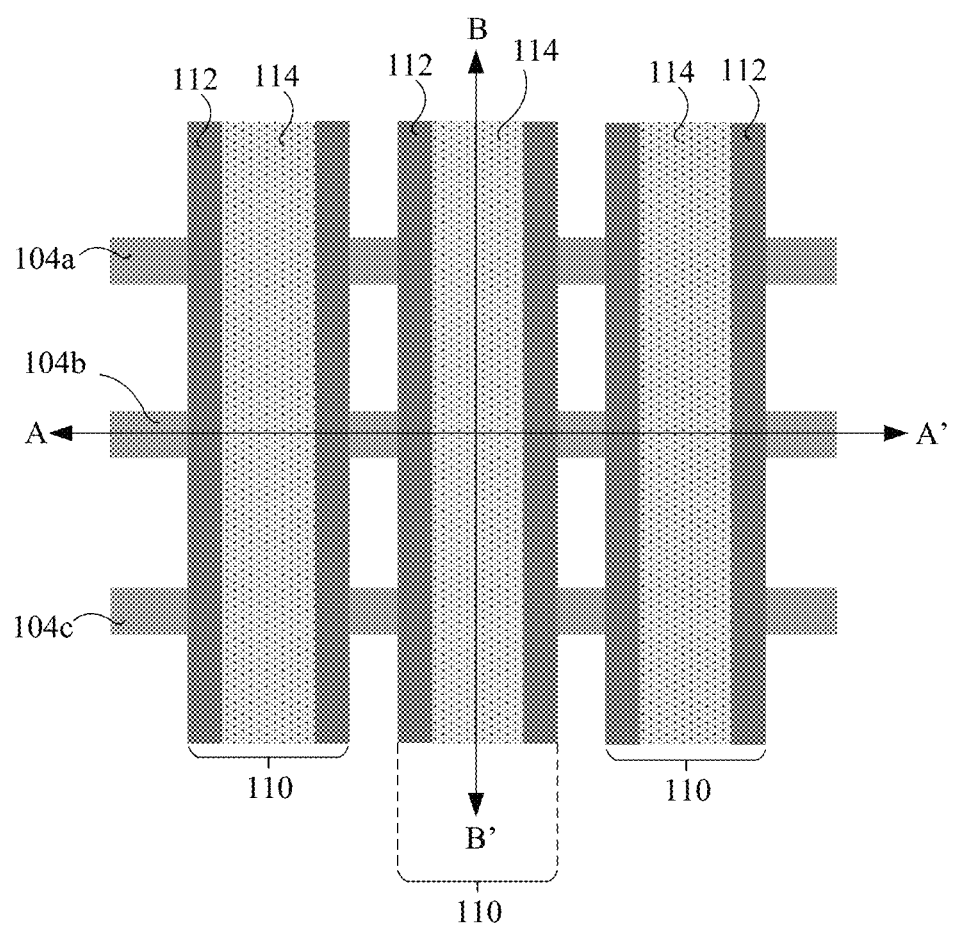
FIG. 1 is a plan view of an exemplary device structure for fabricating a semiconductor device in accordance with embodiments of the present disclosure. In the following figures, line A-A' designates a cross section location for the figures suffixed with "A" and line B-B' designates a cross section location for the figures suffixed with "B".

Referring to FIG. 1, a plan view of an exemplary device structure is shown. The device structure includes one set of device elements targeted for use with embodiments of the present disclosure, but it is understood that embodiments of the present disclosure can be implemented on different designs without any change to the techniques discussed herein. The device structure may be formed by conventional semiconductor fabrication processes. The device structure may include a substrate (not shown in FIG. 1), a plurality of semiconductor features 104a, 104b, and 104c formed on the substrate, and gates 110 disposed on and extending laterally across the semiconductor features 104a, 104b, and 104c. An insulating layer (not shown in FIG. 1) also formed on the substrate and separates the semiconductor features 104a, 104b, and 104c. The plurality of semiconductor features may include a first 104a, second 104b, and third 104c semiconductor features, each semiconductor feature having a top surface.

The gates 110 are flanked on their sides by adjacent gate spacers 112. The gates 114 may include dummy gate structures 114. In some embodiments, the dummy gate structures 114 include amorphous silicon. The device structure also includes dielectric isolation structures (not shown in FIG. 1) extending adjacently along and separating the gates 110.

The semiconductor features 104a, 104b, and 104c may function as active regions in a semiconductor device, e.g., a channel for current flow. The semiconductor features 104a, 104b, and 104c may have various shapes depending on the device architecture. For example, the semiconductor features 104a, 104b, and 104c are shaped like fins.

While the semiconductor features 104a, 104b, and 104c are represented as fins in the accompanying drawings, it should be noted that the fin is used only as a non-limiting example of the semiconductor features 104a, 104b, and 104c, and other architectural forms of the semiconductor feature (e.g., a doped layer on a top surface of a bulk semiconductor substrate or a semiconductor-on-insulator layer) may be used as well. It should also be understood that the present disclosure can be applied to any type of transistor device architecture, such as a three-dimensional device architecture (e.g., FinFETs), or a planar device architecture (e.g., complementary metal oxide semiconductor (CMOS) devices, semiconductor-on-insulator (SOI) devices, etc.).

Figure 2A:
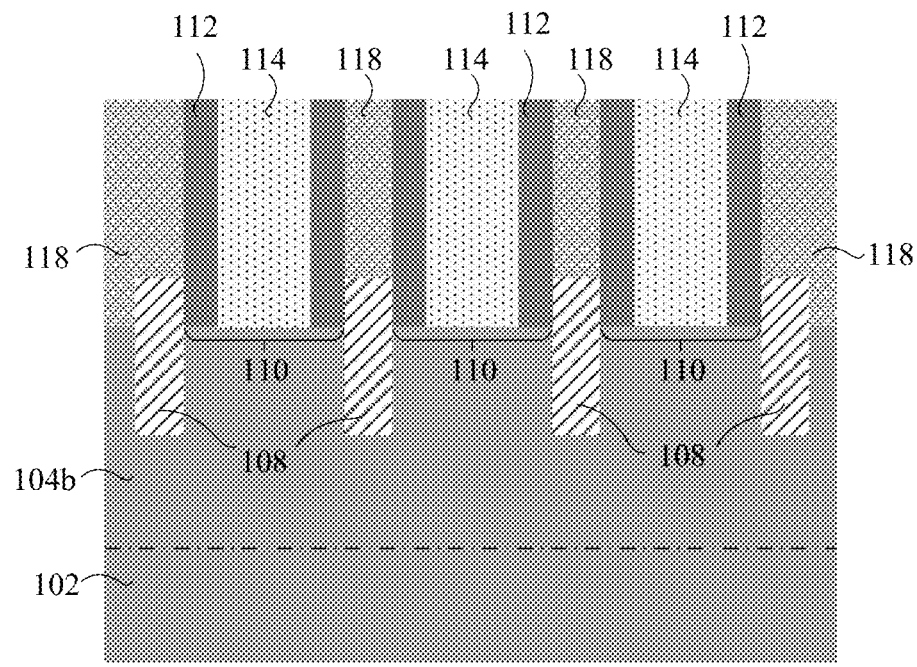
FIGS. 2A and 2B are cross-sectional views of the device structure of FIG. 1, in accordance with embodiments of the present disclosure.

FIG. 2A depicts the cross-sectional view of the structure shown in FIG. 1 along the second semiconductor feature 104b (as indicated by the section line A-A' in FIG. 1). Referring to FIG. 2A, source or drain regions 108 are formed in the second semiconductor feature 104b. The source or drain regions 108 may be formed by epitaxial growth of a semiconductor material, as described herein, with in-situ doping. The source or drain regions 108 may be doped with N-type dopants (e.g., arsenic, phosphorus, or antimony) or P-type dopants (e.g., boron, aluminum, or gallium). For example, the source or drain regions 108 are epitaxial structures that extend above the top surface of the second semiconductor feature 104b.

The term "epitaxial growth" as used herein refers to the growth of a semiconductor material on a deposition surface of a same or different semiconductor material, in which the grown semiconductor material will have the same crystalline characteristics as the deposition surface of the semiconductor material.

As shown in FIG. 2A, the dummy gate structures 114 and the gate spacers 112 are disposed on the second semiconductor feature 104b. The gates 110 are between the source or drain regions 108. Additionally, dielectric isolation structures 118 are disposed on the source or drain regions 108. The dielectric isolation structures 118 may include an oxide-containing dielectric compound or silicon dioxide ($SiO_2$).

The gate spacers 112 may include, but not limited to, silicon dioxide ($SiO_2$), silicon oxide materials enriched or doped with atomic elements selected from the group consisting of carbon, boron, hydrogen and nitrogen (e.g., SiOCN, SiBCN), silicon oxynitride (SiON), SiGe oxide, germanium oxide, silicon oxycarbide, SiCOH dielectrics, or any combination of these materials.

Figure 2B:
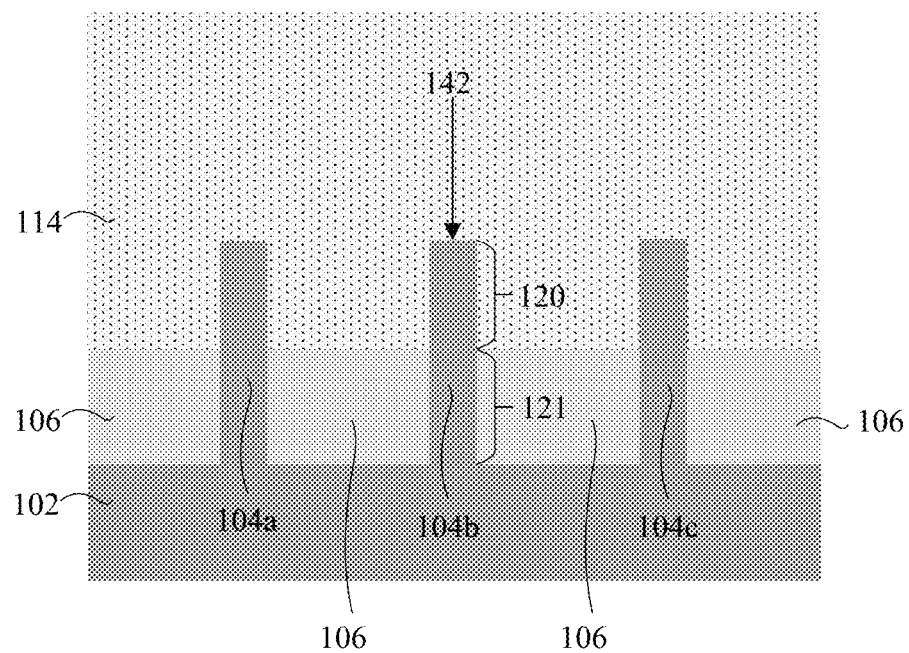

FIG. 2B depicts the cross-sectional view of the structure shown in FIG. 1 along the gate 110 (as indicated by the section line B-B' in FIG. 1). Referring to FIG. 2B, the insulating layer 106 is between the semiconductor features 104a, 104b, and 104c. The insulating layer 106 may be a shallow trench isolation region and may include any dielectric material, such as silicon dioxide or silicon nitride.

As shown in FIG. 2B, the semiconductor features 104a, 104b, and 104c have a lower portion 121 in the insulating layer 106 and an upper portion 120 extending above the insulating layer 106. Additionally, the semiconductor features 104a, 104b, and 104c have top surfaces 142 above the substrate 102 and the insulating layer 106. The dummy gate structure 114 extends laterally across the semiconductor features 104a, 104b, and 104c and overlies the insulating layer 106.

The semiconductor features 104a, 104b, and 104c may be made of any suitable semiconductor material, such as silicon, germanium, silicon germanium, silicon/carbon, other II-VI or III-V semiconductor compounds and the like. The substrate 102 may be made of any suitable semiconductor material, such as silicon (Si), germanium (Ge), silicon germanium (SiGe), silicon/carbon, other II-VI or III-V semiconductor compounds and the like. The substrate 102 may also include an organic semiconductor or a layered semiconductor, such as Si/SiGe, a silicon-on-insulator or a SiGe-on-insulator.

Figure 3A:
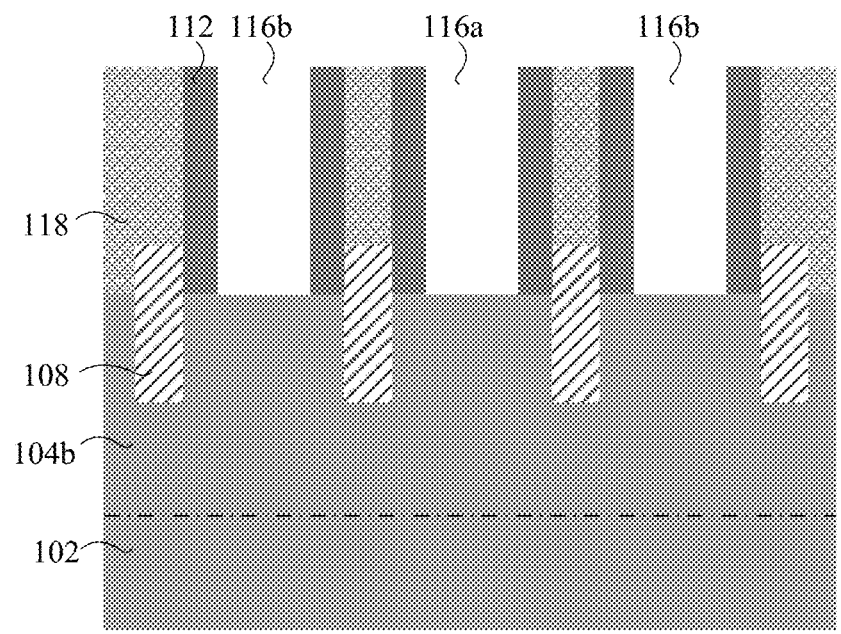
FIGS. 3A and 3B are cross-sectional views of the device structure after formation of gate cavities, in accordance with embodiments of the present disclosure.
Figure 3B:
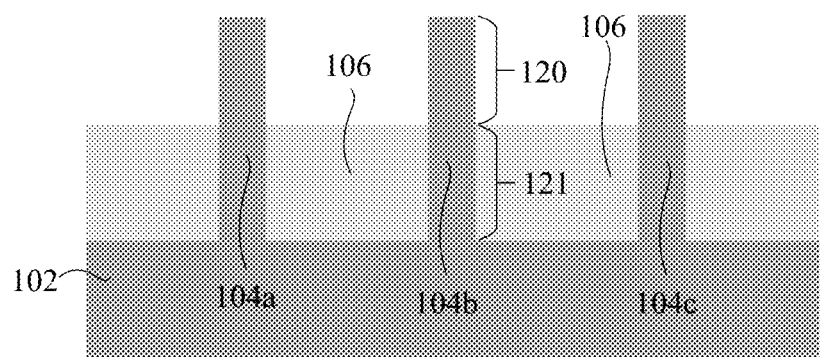

Referring to FIG. 3A and FIG. 3B (FIG. 3A continues from the embodiment shown in FIG. 2A, and FIG. 3B continues from the embodiment shown in FIG. 2B), gate cavities 116a and 116b are formed by removing the dummy gate structures 114. The dummy gate structures 114 may be removed by etching techniques employed in conventional replacement metal gate (RMG) processes (e.g., a wet etch).

As shown in FIG. 3A, the gate cavities may include a first 116a and second 116b gate cavities, each having a pair of gate spacers 112 on its sidewalls. As shown in FIG. 3B, the removal of the dummy gate structure 114 exposes the upper portion 120 of the semiconductor features 104a, 104b, and 104c.

Figure 4A:
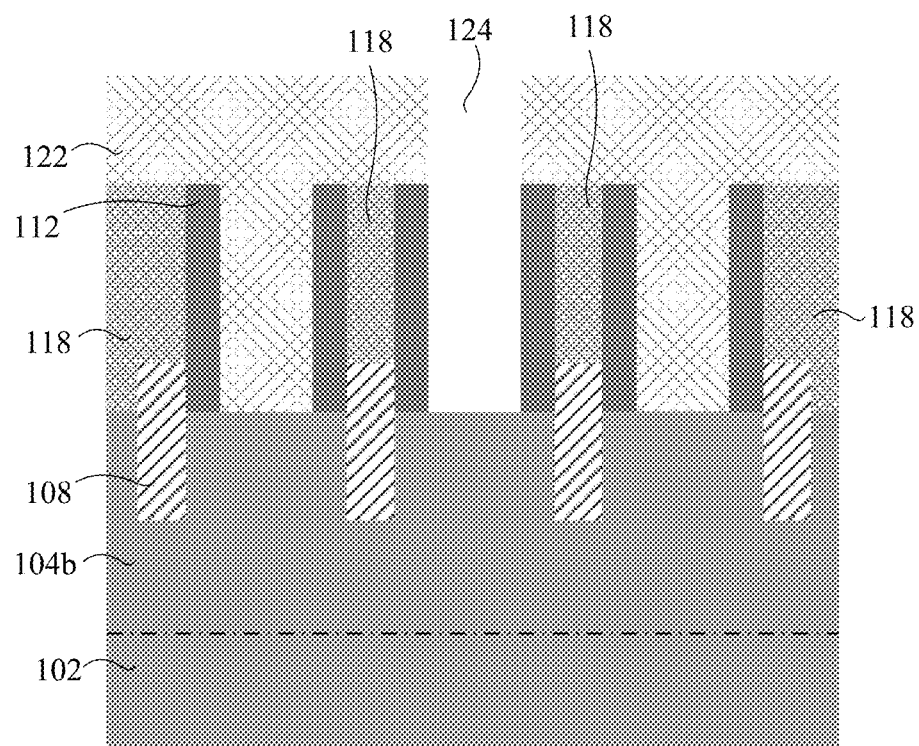
FIGS. 4A and 4B are cross-sectional views of the device structure after patterning a mask layer to define a diffusion break opening, in accordance with embodiments of the present disclosure.
Figure 4B:
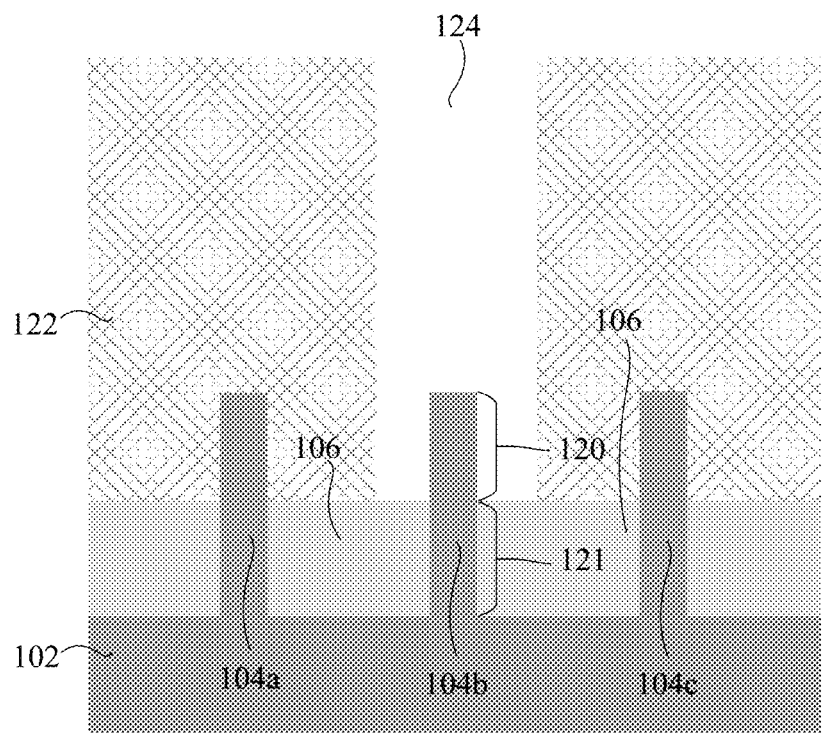

Referring to FIG. 4A and FIG. 4B (FIG. 4A continues from the embodiment shown in FIG. 3A, and FIG. 4B continues from the embodiment shown in FIG. 3B), a mask layer 122 is formed in the gate cavities and then patterned to define a diffusion break opening 124 over the second semiconductor feature 104b and the insulating layer 106.

As shown in FIG. 4A, the patterning of the mask layer 122 includes selectively removing a portion of the mask layer 122 from the first gate cavity above the second semiconductor feature 104b, while retaining a portion of the mask layer 122 in the second gate cavities. As shown in FIG. 4B, the mask layer 122 fills the spaces between the semiconductor features 104a, 104b, and 104c and after the patterning, the diffusion break opening 124 also exposes the upper portion 120 of the second semiconductor feature 104b and adjacent surfaces of the insulating layer 106, while the first and third semiconductor features (104a and 104c, respectively) remain covered.

The mask layer 122 may be formed using conventional deposition processes, such as spin coating or chemical vapor deposition (CVD). The mask layer 122 may be an organic planarization layer (OPL) or a spin-on hard mask (SOH). Examples of the OPL may include any suitable photosensitive organic material such as polyacrylate resin, epoxy resin, phenol resin, polyamide resin, polyimide resin, unsaturated polyester resin, polyphenylenether resin, polyphenylenesulfide resin, or benzocyclobutene (BCB). Examples of the SOH may include a spin-on carbon material containing atoms selected from the group consisting of carbon, hydrogen, oxygen, and nitrogen. In an embodiment, the mask layer 122 is a SOH.

The mask layer 122 may be patterned using conventional photolithographic techniques, which include, but not limited to, wet etch lithographic techniques, dry etch lithographic techniques or direct patterning processes. The patterning of the mask layer 122 may also include deposition of material or photoresist, use of a mask for patterning, exposure, development, etching, cleaning, and/or removal of the material or photoresist.

Figure 5:
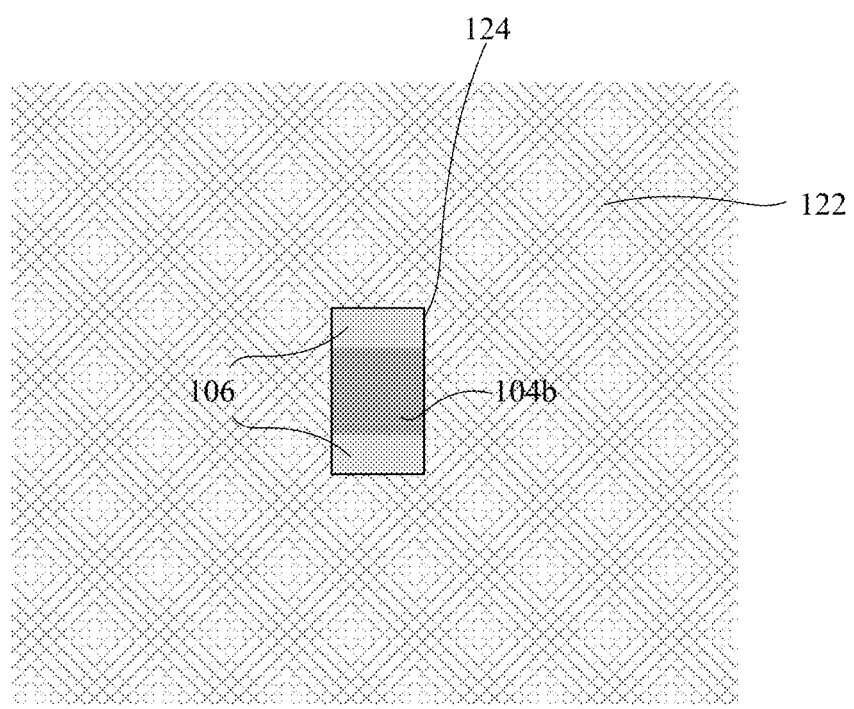
FIG. 5 is a plan view of the device structure shown in FIGS. 4A and 4B after patterning a mask layer to define a diffusion break opening, in accordance with embodiments of the present disclosure.

FIG. 5 illustrates the plan view of the embodiments shown in FIGS. 4A and 4B, where the mask layer 122 is patterned to define the diffusion break opening 124 above the second semiconductor feature 104b and the insulating layer 106.

Figure 6A:
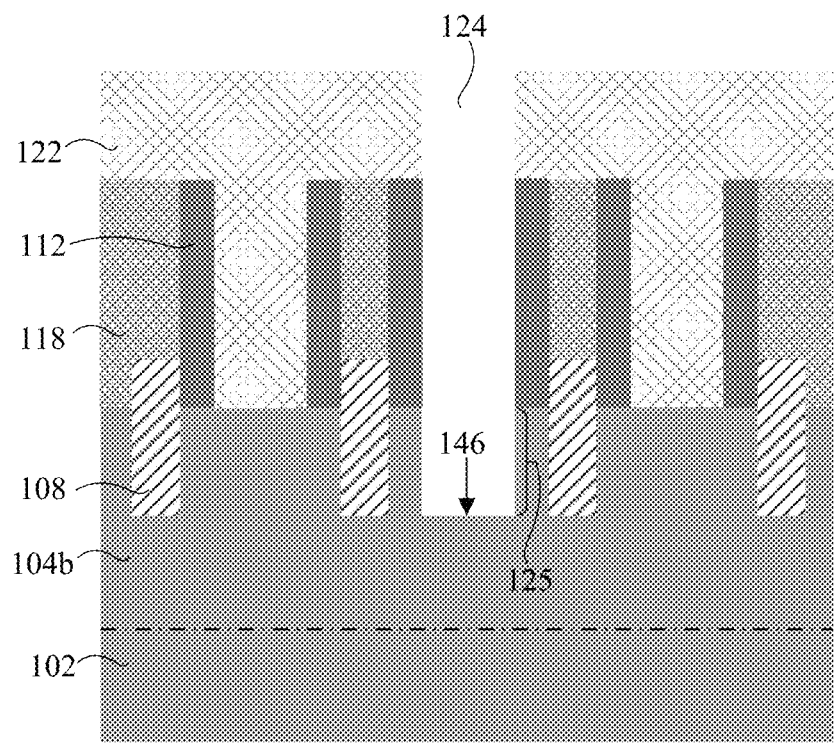
FIGS. 6A and 6B are cross-sectional views of the device structure after forming a recess in a semiconductor feature, in accordance with embodiments of the present disclosure.
Figure 6B:
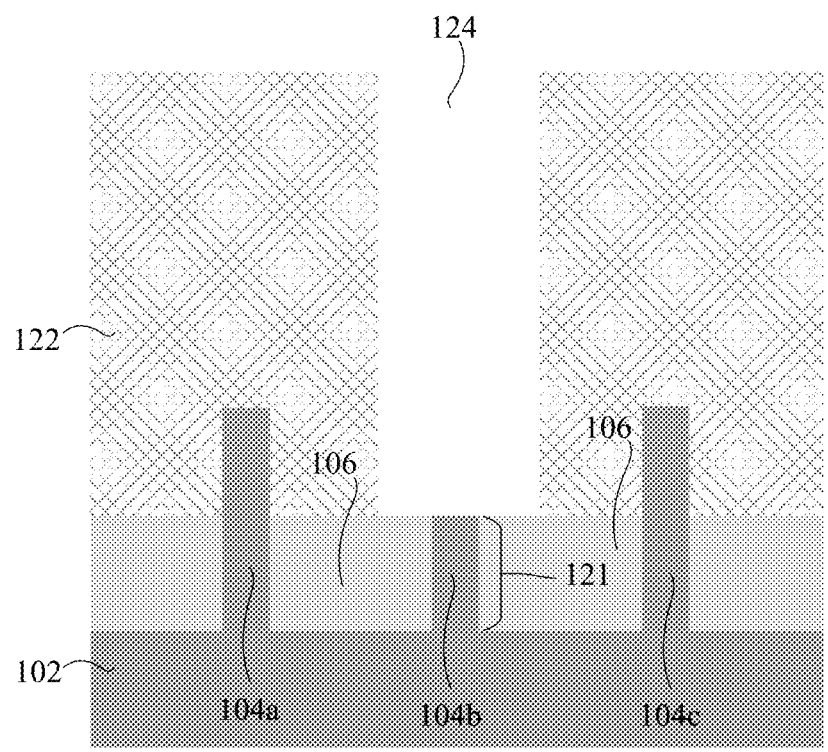

Referring to FIG. 6A and FIG. 6B (FIG. 6A continues from the embodiment shown in FIG. 4A, and FIG. 6B continues from the embodiment shown in FIG. 4B), etching is performed through the diffusion break opening 124 to form a recess 125 in the second semiconductor feature 104b. The recess 125 is formed by removing the upper portion 120 of the second semiconductor feature 104b. The upper portion 120 may be selectively etched using a dry etchant and may be controlled by a predetermined time. In some embodiments, it is preferable for the etching to be anisotropic (e.g., in the vertical direction).

As shown in FIG. 6A, the recess 125 is formed in the second semiconductor feature 104b and has a bottom surface 146 that is coplanar with the insulating layer 106. As shown in FIG. 6B, the lower portion 121 of the second semiconductor feature 104b is exposed after the removal of the upper portion 120, and the lower portion 121 is coplanar with the insulating layer 106.

Figure 7A:
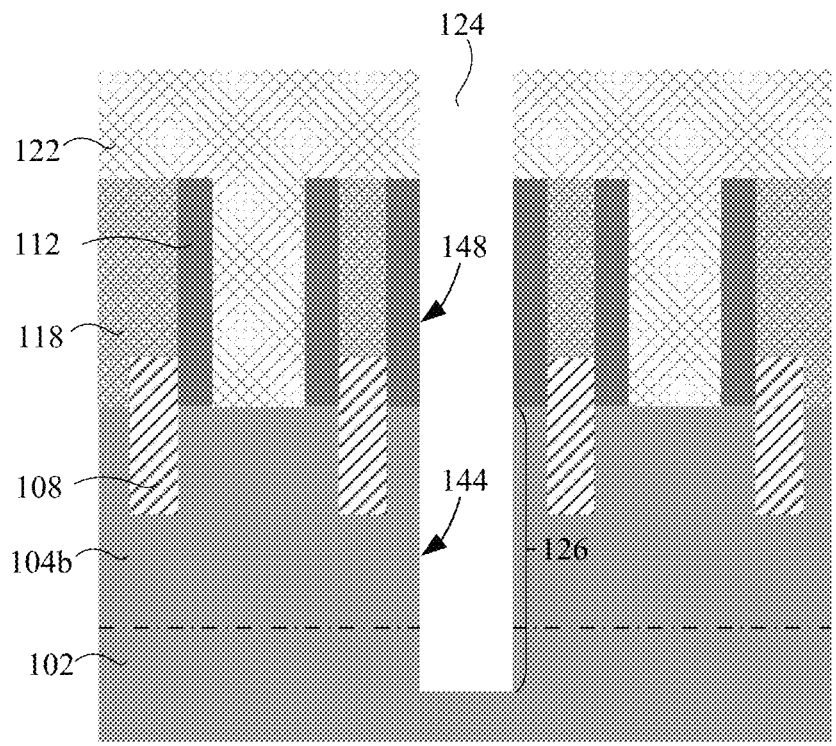
FIGS. 7A and 7B are cross-sectional views of the device structure after forming an isolation trench, in accordance with embodiments of the present disclosure.
Figure 7B:
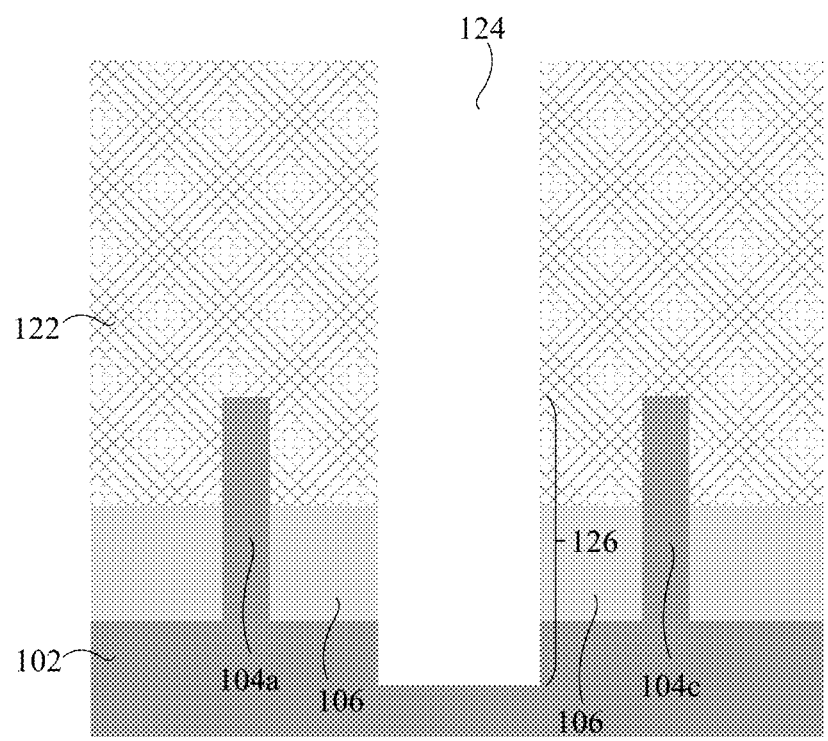

Referring to FIG. 7A and FIG. 7B (FIG. 7A continues from the embodiment shown in FIG. 6A, and FIG. 7B continues from the embodiment shown in FIG. 6B), the second semiconductor feature 104b and the insulation layers 106 are etched vertically (e.g., using a dry etchant) through the diffusion break opening 124 to extend the recess 125 into the substrate 102, thereby forming an isolation trench 126.

As shown in FIG. 7A, the isolation trench 126 has substantially vertical sidewalls 144 that are aligned with inner sidewalls 148 of the pair of gate spacers 112 above the isolation trench 126.

As shown in FIG. 7B, the isolation trench 126 extends through the insulating layer 106 and into the substrate 102. During the vertical etch, the lower portion 121 of the second semiconductor feature 104b (i.e., entirely removing this section of the semiconductor feature 104b) and the insulating layer 106 are removed simultaneously. For example, the materials in the second semiconductor feature 104b and the insulating layer 106 are etched at substantially equal etch rates (i.e., non-selective etching).

Figure 8A:
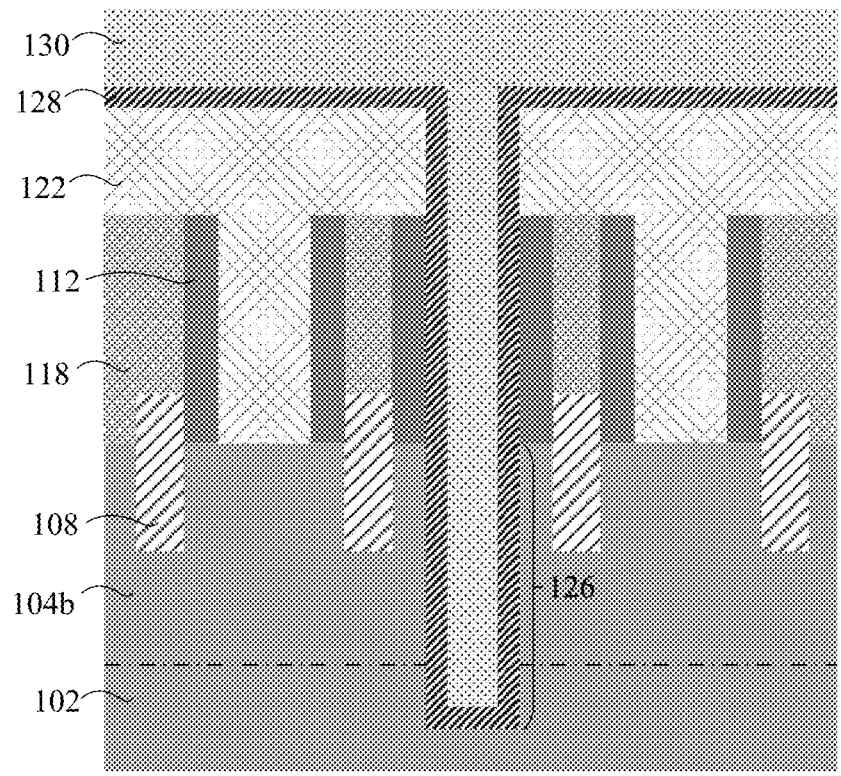
FIGS. 8A and 8B are cross-sectional views of the device structure after forming a barrier layer and a dielectric fill in the isolation trench, in accordance with embodiments of the present disclosure.
Figure 8B:
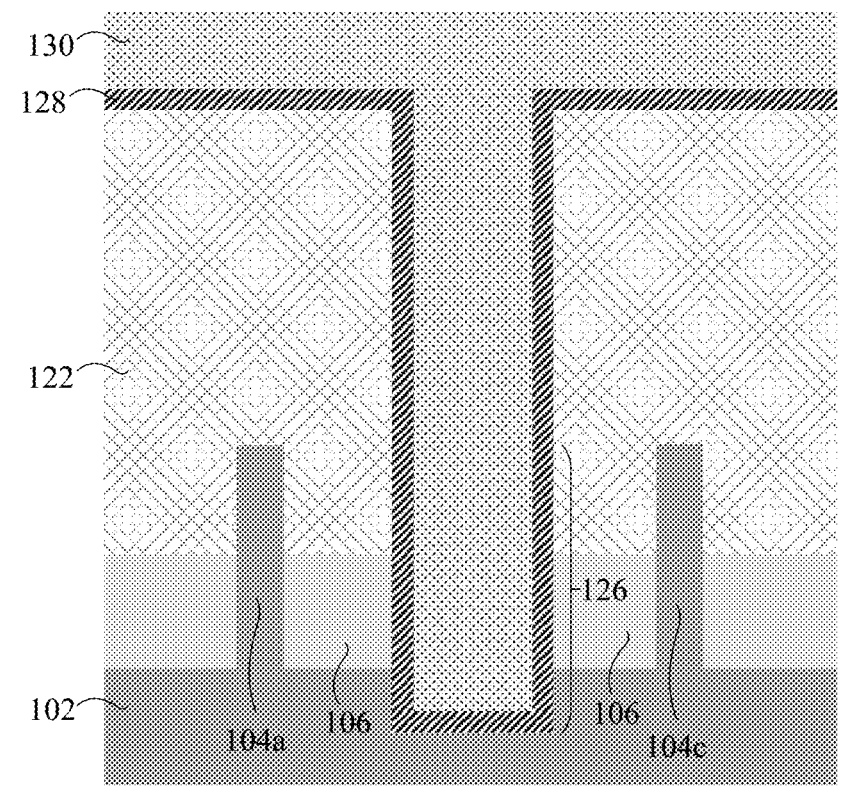

Referring to FIG. 8A and FIG. 8B (FIG. 8A continues from the embodiment shown in FIG. 7A, and FIG. 8B continues from the embodiment shown in FIG. 7B), a barrier layer 128 and a dielectric fill 130 are formed over the device structure and within the diffusion break opening 124 and the isolation trench 126.

The barrier layer 128 and the dielectric fill 130 may be formed by conventional deposition processes, such as chemical vapor deposition (CVD), molecular beam deposition (MBD), pulsed laser deposition (PLD), liquid source misted chemical deposition (LSMCD), atomic layer deposition (ALD), etc. However, a highly conformal deposition process is preferred for depositing the barrier layer 128; for example, an ALD process or a highly-controlled CVD process.

The barrier layer 128 conforms to the isolation trench 126 and the dielectric fill 130 is deposited over the barrier layer 128. As shown in FIG. 8A, the barrier layer 128 lines the isolation trench 126, the pair of gate spacers 112, and the mask layer 122. As shown in FIG. 8B, the barrier layer 128 is also deposited on the insulating layer 106. In some embodiments, the dielectric fill 130 is deposited directly on the barrier layer 128.

The dielectric fill 130 includes an insulating material, such as a nitride-containing dielectric compound, silicon nitride, an oxide-containing dielectric compound, silicon dioxide or carbon-doped silicon oxide. The barrier layer 128 may act as a barrier to prevent the diffusion of molecules between the dielectric fill 130 and the semiconductor feature 104b and may include a nitride-containing dielectric compound, silicon nitride, silicon carbonitride (SiCN), or SiOCN. In some embodiments (not shown), the dielectric fill 130 and the barrier layer 128 are made of the same material and are deposited by a single deposition process. In some embodiments, the barrier layer 128 and the dielectric fill 130 are formed under low-temperature conditions, e.g., between ambient temperature (e.g., 20° C. to 30° C.) to 400° C.

Figure 9A:
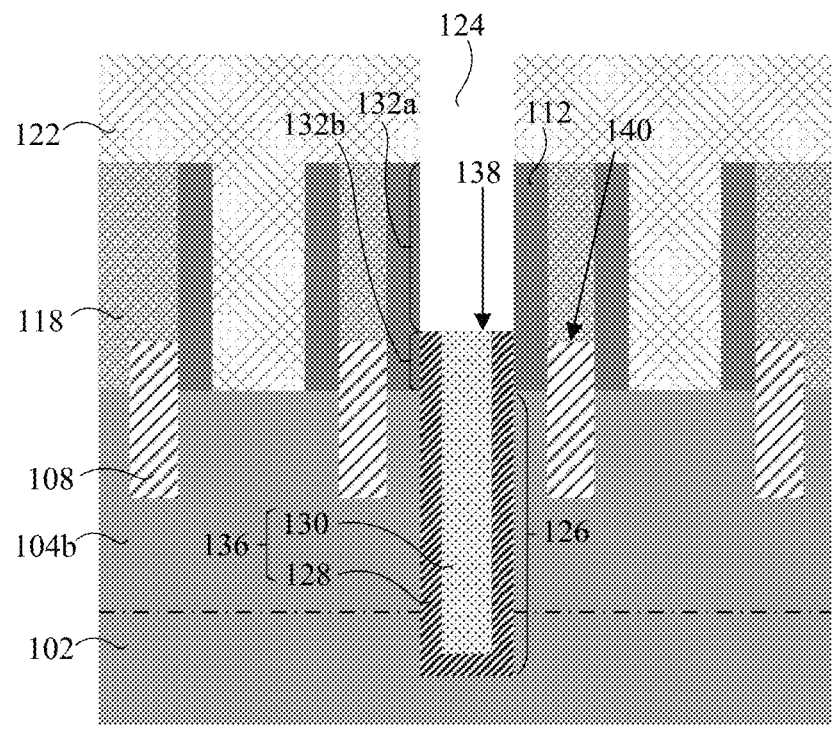
FIGS. 9A and 9B are cross-sectional views of the device structure after recessing the barrier layer and the dielectric fill, in accordance with embodiments of the present disclosure.
Figure 9B:
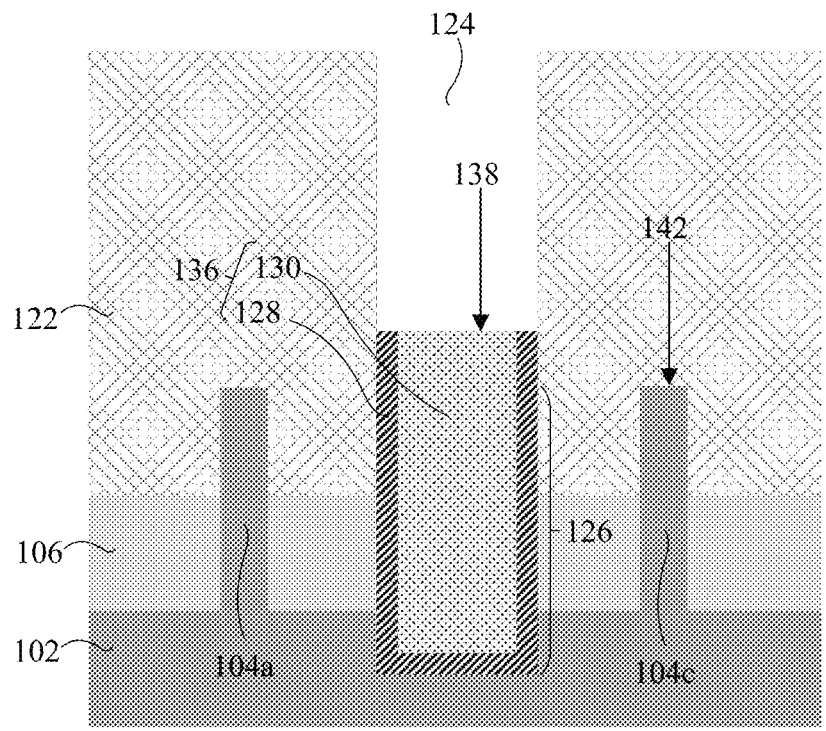

Referring to FIG. 9A and FIG. 9B (FIG. 9A continues from the embodiment shown in FIG. 8A, and FIG. 9B continues from the embodiment shown in FIG. 8B), the barrier layer 128 and the dielectric fill 130 are recessed within the diffusion break opening 124. An isolation structure 136 is formed and includes the barrier layer 128 and the dielectric fill 130. The isolation structure 136 may function as a "diffusion break" isolation structure to break the diffusion of electrical charges in the semiconductor feature 104b. The recessing of the barrier layer 128 and the dielectric fill 130 may be performed using a selective isotropic or anisotropic etching with a dry etchant or a wet etchant and controlled by a predetermined time.

The isolation structure 136 has a top surface 138 that is above top surfaces 140 of the source or drain regions 108. As shown in FIG. 9A, the recessing of the barrier layer 128 and the dielectric fill 130 to form an isolation structure 136 will expose an upper portion 132a of the gate spacers 112, while a lower portion 132b remains covered. In some embodiments, the barrier layer 128 and the dielectric fill 130 are recessed such that the top surface 138 of the isolation structure 136 is proximally above the top surfaces 140 of the source or drain regions 108. Since the sidewalls of the isolation trench are aligned with the inner sidewalls of the pair of gate spacers 112, the isolation structure 136 is formed between and spaced apart from the source or drain regions 108 in the second semiconductor feature 104b.

It should be understood that the top surface 138 of the isolation structure 136 illustrated in FIG. 9A is co-planar with the top surface 138 of the isolation structure 136 illustrated in FIG. 9B. As shown in FIG. 9B, the top surface 138 of the isolation structure 136 is at a level higher than the top surface 142 of the adjacent semiconductor features 104a and 104c.

Figure 10A:
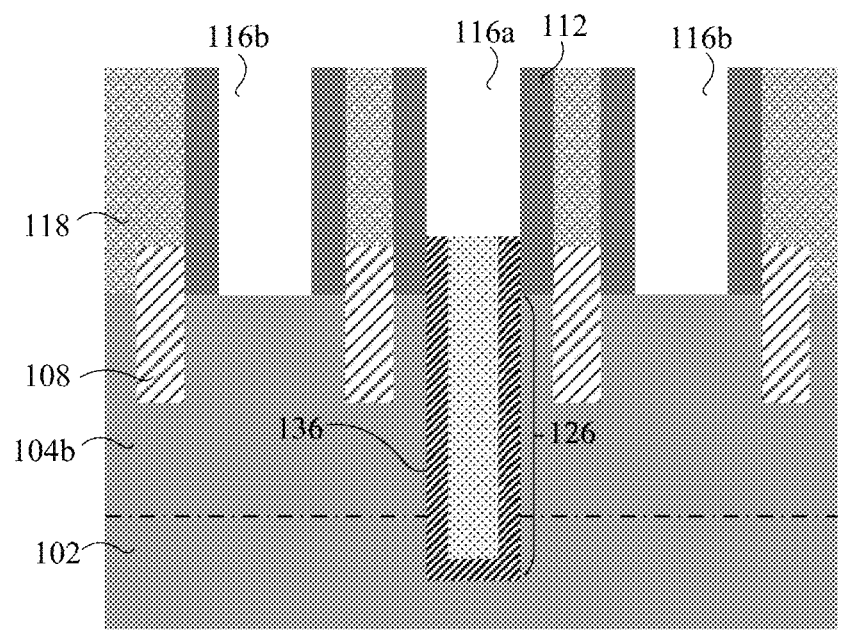
FIGS. 10A and 10B are cross-sectional views of the device structure after removal of the mask layer, in accordance with embodiments of the present disclosure.
Figure 10B:
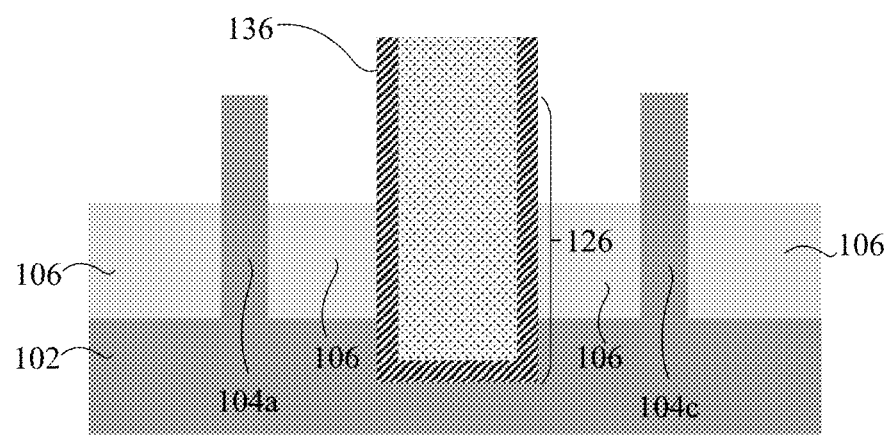

Referring to FIGS. 10A and 10B (FIG. 10A continues from the embodiment shown in FIG. 9A, and FIG. 10B continues from the embodiment shown in FIG. 9B), the mask layer 122 is removed. The removal of the mask layer 122 may be performed using any removal techniques in conventional semiconductor fabrication, such as ashing or a selective etch.

As shown in FIG. 10A, the removal of the mask layer 122 exposes the gate cavities 116a and 116b. In the embodiment shown in FIG. 10B, the removal of the mask layer 122 exposes the first and third semiconductor features (104a and 104c, respectively) adjacent to the isolation structure 136 as well as the underlying insulating layer 106.

Figure 11A:
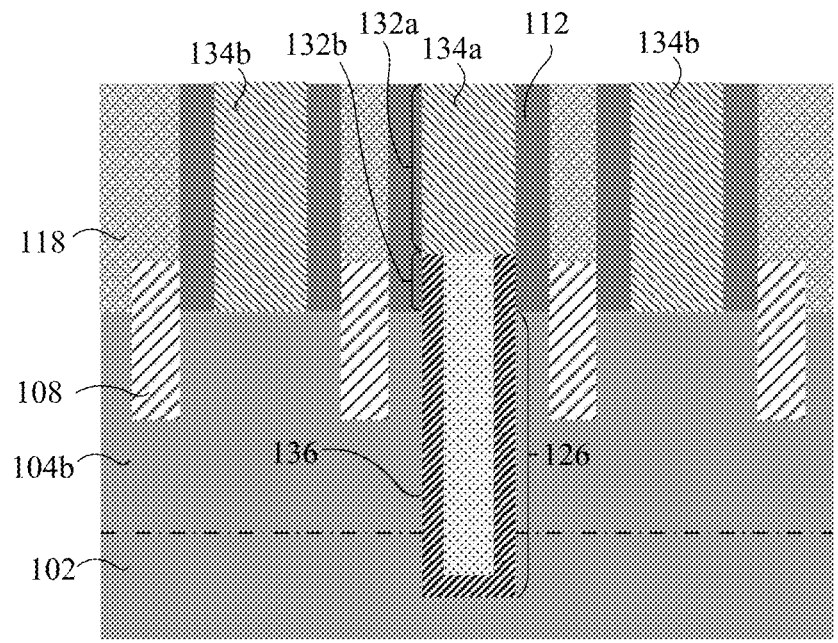
FIGS. 11A and 11B are cross-sectional views of the device structure after formation of conductive gate structures in the gate cavities, in accordance with embodiments of the present disclosure.
Figure 11B:
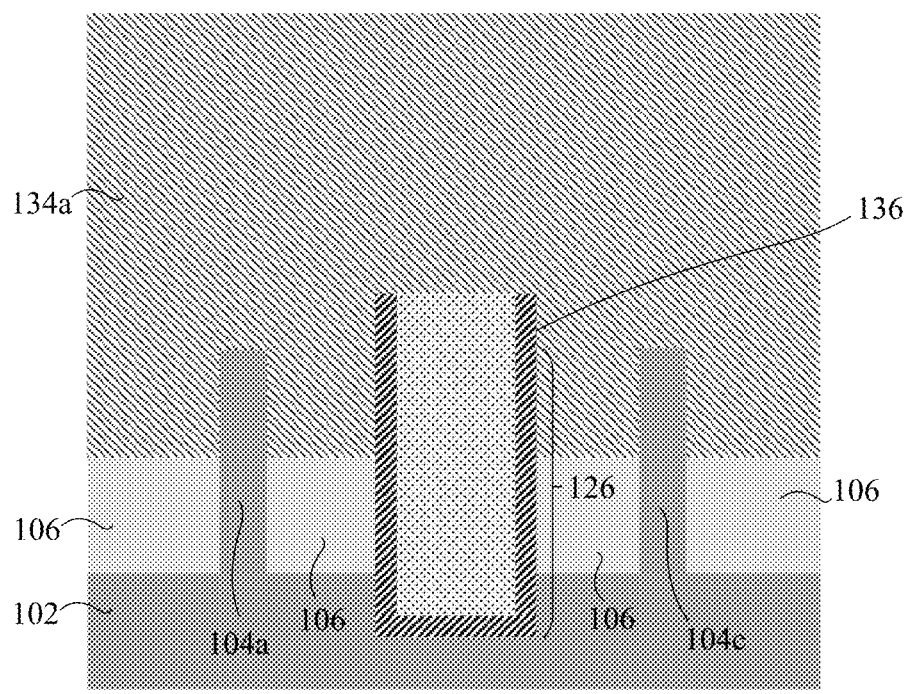

Referring to FIGS. 11A and 11B (FIG. 11A continues from the embodiment shown in FIG. 10A, and FIG. 11B continues from the embodiment shown in FIG. 10B), conductive gate structures 134a and 134b are formed in the gate cavities 116a and 116b. The formation of the conductive gate structures 134a and 134b may be performed by any conventional replacement metal gate (RMG) process. It should be understood that the RMG process is described at this point in the sequence as an example. The RMG process will be apparent to those of ordinary skill in the art without departing from the scope and spirit of this disclosure.

As shown in FIG. 11A, a first conductive gate structure 134a is disposed on the isolation structure 136 and adjacent second conductive gate structures 134b are disposed on the second semiconductor feature 104b. The first conductive gate structure 134a is disposed between and on the upper portions 132a of the pair of gate spacers 112. The isolation structure 136 has a lower portion disposed in the isolation trench 126 and has an upper portion extending above the top surface of the second semiconductor feature 104b. Additionally, the upper portion of the isolation structure 136 is disposed between and on the lower portions 132b of the pair of gate spacers 112 that extend above the top surface of the second semiconductor feature 104b.

As shown in FIG. 11B, the isolation structure 136 is between the first and third semiconductor features (104a and 104c, respectively) and separated by the insulating layer 106. The first conductive gate structure 134a is disposed on the isolation structure 136 and extends laterally over the first and third semiconductor features (104a and 104c, respectively) and the insulating layer 106.

The conductive gate structures 134a and 134b may include electrically conductive materials. Examples of electrically conductive materials may include, but not limited to, tungsten (W), cobalt (Co), nickel (Ni), aluminum (Al), and polysilicon (Si). In an embodiment, the conductive gate structures 134a and 134b preferably includes tungsten.

Although not shown in the accompanying drawings, the conductive gate structures 134a and 134b may also include additional gate components to provide further electrical isolation or to improve gate operating parameters. For example, the conductive gate structures 134a and 134b may include a work-function material layer and a gate dielectric layer. The gate dielectric layer may be placed on the semiconductor features 104a, 104b, and 104c, while the work-function material layer may be placed on the gate dielectric layer. Additionally, the electrically conductive material may be placed on the work-function material layer.

The gate dielectric layer may include, but not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), a silicate thereof, and an alloy thereof. Each value of x is independently from 0.5 to 3 and each value of y is independently from 0 to 2.

The work-function material layer may include any metallic compound or a composition of metallic compounds capable of modifying the work function property of a gate electrode. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof.

Advantageously, the present structure and method are found to improve the electrical isolation (i.e., the diffusion break region) within an active semiconductor layer. For example, the vertical etching enables the formation of a wider isolation trench without eroding the adjacent source or drain region (i.e., a bowed section in the isolation trench), thereby enabling the formation of a wider diffusion break isolation structure to provide improved electrical isolation. Additionally, the dielectric materials in the barrier layer 128 and the dielectric fill 130 of the isolation structure 136 is found to provide better electrical insulation between active components in an IC device.

Also advantageously, the present method is found to avoid the occurrence of faceted epitaxial structures in source or drain regions after the formation of the isolation structures. Additionally, the present method is also found to prevent the formation of a bowed section in the isolation trench and the loss of materials in the adjacent source or drain regions.

More advantageously, the present device is found to provide increased flexibility of designing electrical interconnections between active regions in an IC device by enabling electrical signals to be routed over and across the isolation structure. For example, by forming the first conductive gate structure 134a on the isolation structure 136 and extending laterally across the adjacent the first and third semiconductor features (104a and 104c, respectively), it is found that such a configuration enables greater flexibility in designing electrical circuits in an IC device.

Throughout this disclosure, the terms top, upper, upwards, over, and above refer to the direction away from the substrate. Likewise, the terms bottom, lower, downwards, under, and below refer to the direction towards the substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the methods of forming the semiconductor structure disclosed herein may be employed in manufacturing a variety of different integrated circuit products, including, but not limited to, logic products, memory products, 3D transistor devices, FinFET transistor devices, planar transistor devices, CMOS devices, SOI devices etc.

What is claimed is:

1. A semiconductor device comprising:
a semiconductor feature above a substrate;
a pair of gate spacers having upper and lower portions on the semiconductor feature;
an isolation trench in the semiconductor feature;
an isolation structure having a lower portion disposed in the isolation trench and having an upper portion disposed between the lower portions of the pair of gate spacers that extends above the semiconductor feature; and
a conductive gate structure disposed on the isolation structure and between the upper portions of the pair of gate spacers.

2. The semiconductor device of claim 1, wherein the isolation structure includes a barrier layer lining the isolation trench and the lower portions of the pair of gate spacers, and a dielectric fill disposed over the barrier layer.

3. The semiconductor device of claim 2, wherein the barrier layer includes a nitride-containing dielectric compound and the dielectric fill includes an oxide-containing dielectric compound.

4. The semiconductor device of claim 1, wherein the isolation trench has substantially vertical sidewalls that are aligned with inner sidewalls of the pair of gate spacers.

5. The semiconductor device of claim 1, wherein the isolation trench extends into the substrate.

6. The semiconductor device of claim 1, further comprising source or drain regions in the semiconductor feature, wherein the isolation structure is between and spaced apart from the source or drain regions.

7. The semiconductor device of claim 6, wherein the isolation structure has a top surface that is above top surfaces of the source or drain regions.

8. The semiconductor device of claim 1, wherein the conductive gate structure is a first conductive gate structure and further comprising an adjacent second conductive gate structure disposed on the semiconductor feature.

9. The semiconductor device of claim 8, wherein the first and second conductive gate structures include an electrically conductive material.

10. A semiconductor device comprising:
a first, second and third semiconductor features above a substrate;
a pair of gate spacers having upper and lower portions disposed on and extending laterally across the first, second and third semiconductor features;
an isolation trench in the second semiconductor feature;
an isolation structure having a lower portion disposed in the isolation trench and having an upper portion disposed between the lower portions of the pair of gate spacers that extends above the second semiconductor feature; and
a conductive gate structure disposed on the isolation structure and between the upper portions of the pair of gate spacers, wherein the conductive gate structure extends laterally over the first and third semiconductor features.

11. The semiconductor device of claim 10, further comprising an insulating layer disposed on the substrate, wherein the first and third semiconductor features and the isolation structure are separated by the insulating layer.

12. The semiconductor device of claim 11, wherein the isolation trench extends through the insulating layer and into the substrate.

13. The semiconductor device of claim 11, wherein the conductive gate structure extends over the insulating layer.

14. The semiconductor device of claim 10, wherein the isolation structure has a top surface that is at a level higher than top surfaces of the first and third semiconductor features.

15. The semiconductor device of claim 12, wherein the isolation trench has substantially vertical sidewalls that are aligned with inner sidewalls of the pair of gate spacers.

16. The semiconductor device of claim 10, further comprising source or drain regions in the semiconductor feature, wherein the isolation structure is between and spaced apart from the source or drain regions.

17. The semiconductor device of claim 16, wherein the isolation structure has a top surface that is above top surfaces of the source or drain regions.

18. The semiconductor device of claim 15, wherein the isolation structure includes a barrier layer lining the isolation trench and the lower portions of the pair of gate spacers, and a dielectric fill disposed over the barrier layer.

19. The semiconductor device of claim 18, wherein the barrier layer includes a nitride-containing dielectric compound and the dielectric fill includes an oxide-containing dielectric compound.

* * * * *